United States Patent [19]

Atriss et al.

[11] Patent Number: 5,359,234
[45] Date of Patent: Oct. 25, 1994

[54] CIRCUIT AND METHOD OF SENSING PROCESS AND TEMPERATURE VARIATION IN AN INTEGRATED CIRCUIT

[75] Inventors: Ahmad H. Atriss, Chandler; Benjamin C. Peterson, Tempe; Lanny L. Parker, Mesa, all of Ariz.

[73] Assignee: Codex, Corp., Mansfield, Mass.

[21] Appl. No.: 11,611

[22] Filed: Feb. 1, 1993

[51] Int. Cl.[5] .................. H01L 31/00; G06G 7/10; H03K 13/17
[52] U.S. Cl. ................... 307/310; 307/491; 328/3; 377/25
[58] Field of Search ............ 307/310, 491; 328/3; 377/25, 64, 77

[56] References Cited

U.S. PATENT DOCUMENTS 3,603,979  9/1971  Kosakowski ............... 328/3
3,713,033  1/1973  Frerking ................... 328/3
4,237,420  12/1980  Ebihara et al. ............ 307/310

Primary Examiner—Timothy P. Callahan
Assistant Examiner—Toan Tran
Attorney, Agent, or Firm—Robert D. Atkins

[57] ABSTRACT

A voltage controlled oscillator runs at full speed to generate an output frequency dependent on temperature and process variation. First and second clock signals are generated from the oscillator signal, while third and fourth clock signals are developed in response to an input clock signal. The number of clock signals occurring during a first state of the third clock signal are counted for providing a plurality of output signals also indicative of the temperature and process variation. The plurality of output signals compensate an input signal for the temperature and process variation for providing an output signal.

15 Claims, 5 Drawing Sheets

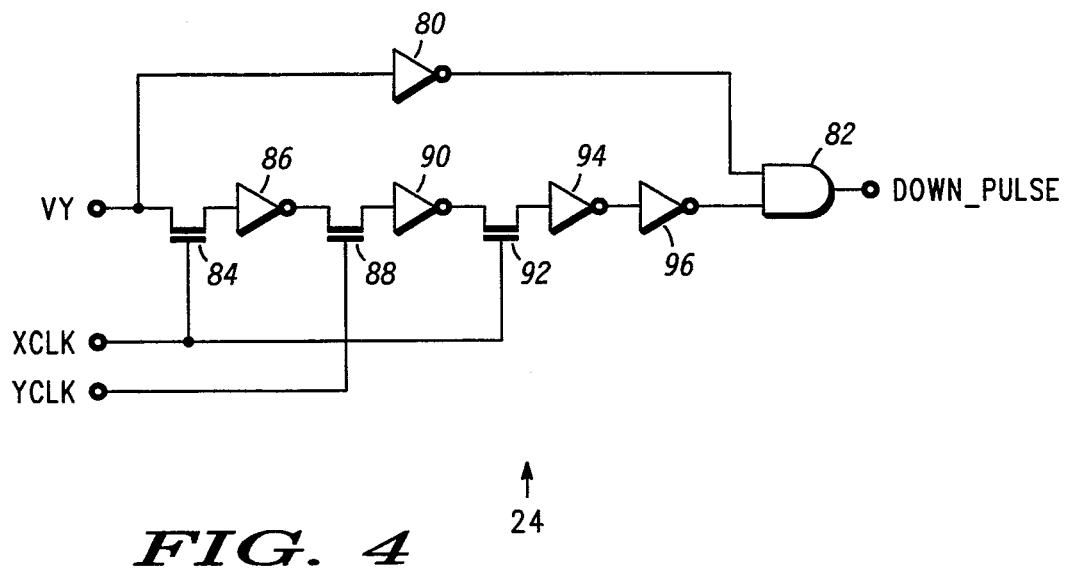
FIG. 4
FIG. 5
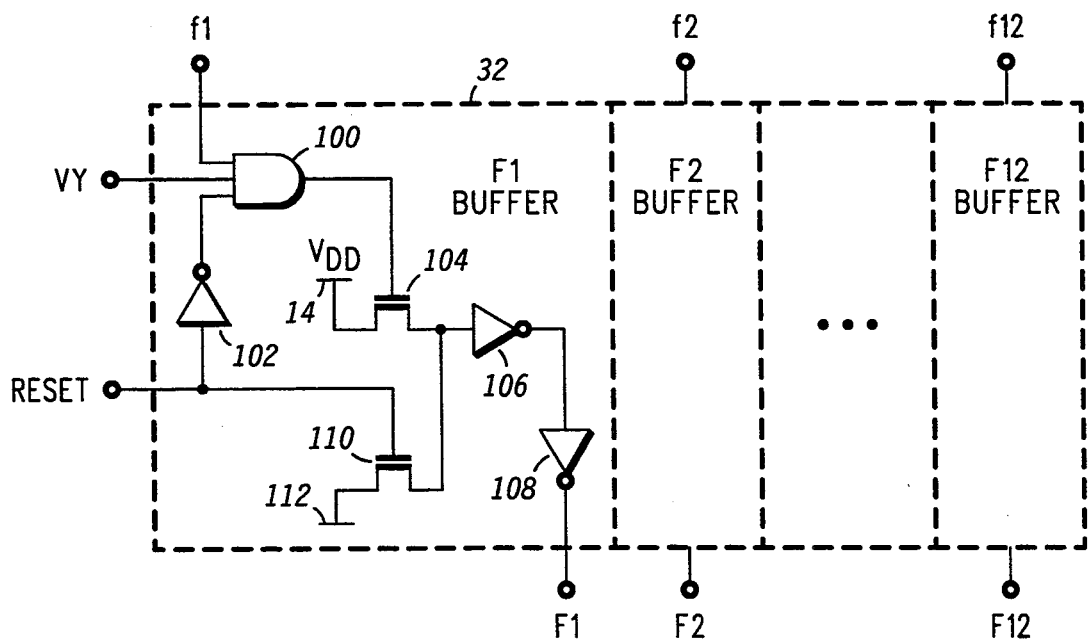

CIRCUIT AND METHOD OF SENSING PROCESS AND TEMPERATURE VARIATION IN AN INTEGRATED CIRCUIT

BACKGROUND OF THE INVENTION

The present invention relates in general to integrated circuit design and, more particularly, to sensing process and temperature variation in an integrated circuit (IC) and providing compensation therefor.

A common problem facing circuit designers is variation in operating characteristics of the IC as a function of temperature and process conditions and power supply levels. An IC may operate much faster, say 320 MHz, under best case conditions with low temperature and a high power supply potential. Under worst case conditions with high temperature and a low power supply potential, the IC may achieve only 100 MHz. The manufacturing process also has a direct effect on the ultimate performance of the IC. For example, process variation may effect device gate length, junction depth and gate oxide thickness which make the response unpredictable. The sizing of individual transistors and relative switching thresholds is also dependent upon process and temperature.

The uncertainty in performance hampers accurate calculation of setup and hold times in critical signal paths of the overall circuit design. Furthermore, with an unknown operating environment it is difficult to determine switching thresholds of the input and output buffers which are necessary to interface with external logic families.

Hence, a need exists to compensate an IC for temperature, process and power supply variation and bring a level of certainty to IC design.

BRIEF DESCRIPTION OF THE DRAWING

FIG. 4 is a schematic diagram illustrating the down detector of FIG. 1;

FIG. 5 is a schematic diagram illustrating the buffer circuit of FIG. 1;

DETAILED DESCRIPTION OF THE PREFERRED EMBODIMENT

Figure 1:
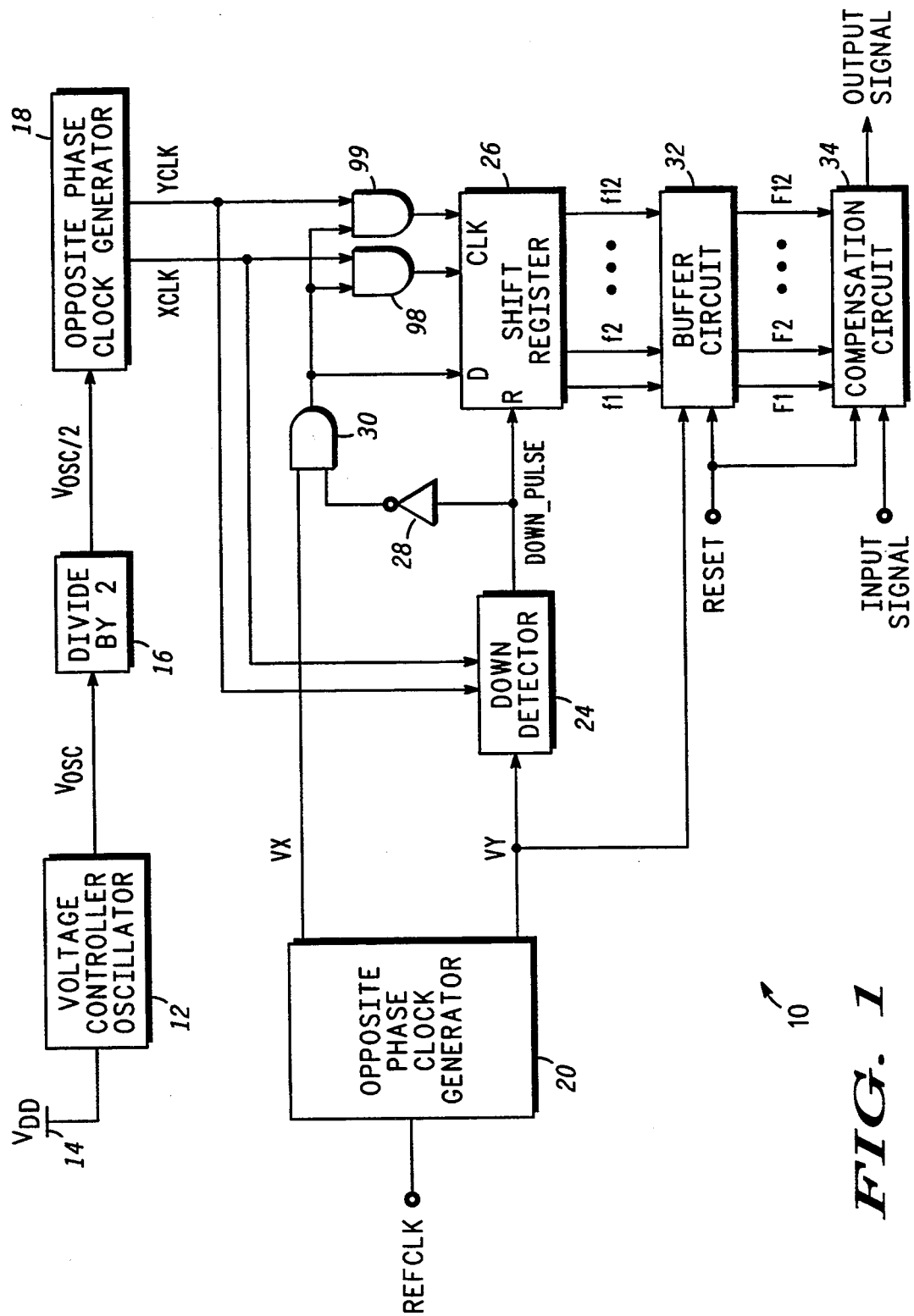
FIG. 1 is a block diagram illustrating a circuit for sensing temperature and process variation.

A circuit 10 for sensing temperature and process variation is shown in FIG. 1 suitable for manufacturing as an integrated circuit using conventional CMOS integrated circuit processes. A voltage controlled oscillator (VCO) 12 has an input coupled to power supply conductor 14 operating a positive power supply potential $V_{DD}$ such as 5.0 volts. VCO 12 may comprise an odd number of serially coupled controllable inverter stages with an output of the last inverter stage coupled to an input of the first inverter stage. Divide-by-2 circuit 16 reduces the $V_{OSC}$ frequency to $V_{OSC}/2$ for application to a first opposite phase clock generator 18 for providing non-overlapping, opposite phase XCLK and YCLK clock signals operating an one-half the output frequency of VCO 12.

With its input connected to power supply potential $V_{DD}$, VCO 12 oscillates at its maximum output frequency $V_{OSC}$ given existing process and temperature conditions and power supply potential. Under best case conditions VCO 12 may operate at 320 MHz, while under worst case conditions VCO 12 may operate at 100 MHz. Even after silicon processing, the IC retains certain inherent tracts due to process variables such as gate length, junction depth, gate oxide thickness and threshold voltage which makes the output frequency response of VCO 12 unpredictable. A key feature of the present invention is the ability to measure and quantify the response of VCO 12 operating dependent on process, temperature and power supply level variation. Once temperature and process variation is measured and quantified under real operating conditions, it is possible to compensate another input signal which is presumably experiencing similar variation.

A digital input signal-REFCLK operating at say 5 MHz is applied at a second opposite phase clock generator 20 for providing non-overlapping, opposite phase VX and VY clock signals. The duration of the VX and VY clock signals is 200 ns. The VY clock signal processes through down detector 24 and produces a logic one DOWN_PULSE at each zero-going transition of the VY clock signal. The pulse width of the DOWN_PULSE is one cycle of the $V_{OSC}/2$ clock signal. The DOWN_PULSE signal is applied at the reset (R) input of shift register 26 to reset it at each zero-going transition of the VY clock signal. Down detector 24 and shift register 26 receive XCLK and YCLK clock signals. The DOWN_PULSE signal is also inverted by inverter 28 and "anded" with the VX clock signal through AND gate 30 for application to the data (D) input of shift register 26. Shift register 26 contains sixteen 1-bit cells with outputs f1, f2 through f12 corresponding to the fifth through the sixteenth bit cells. The first four bit cells are used as buffers for the fifth bit cell. Data shifts from the data input of shift register 26 into the first data cell then to the second data cell through the sixteenth data cell at each XCLK and YCLK clock cycle. The number of logic ones clocked into shift register 26 by the XCLK and YCLK clock signals, which are dependent on temperature and process, is a quantified measure of that temperature and process. Buffer circuit 32 buffers outputs f1-f12 upon receiving the VY clock signal and provides outputs F1-F12. Compensation circuit 34 makes adjustments to an INPUT SIGNAL in response to outputs F1-F12 for providing an OUTPUT SIGNAL with compensation for temperature and process variation.

Figure 2:
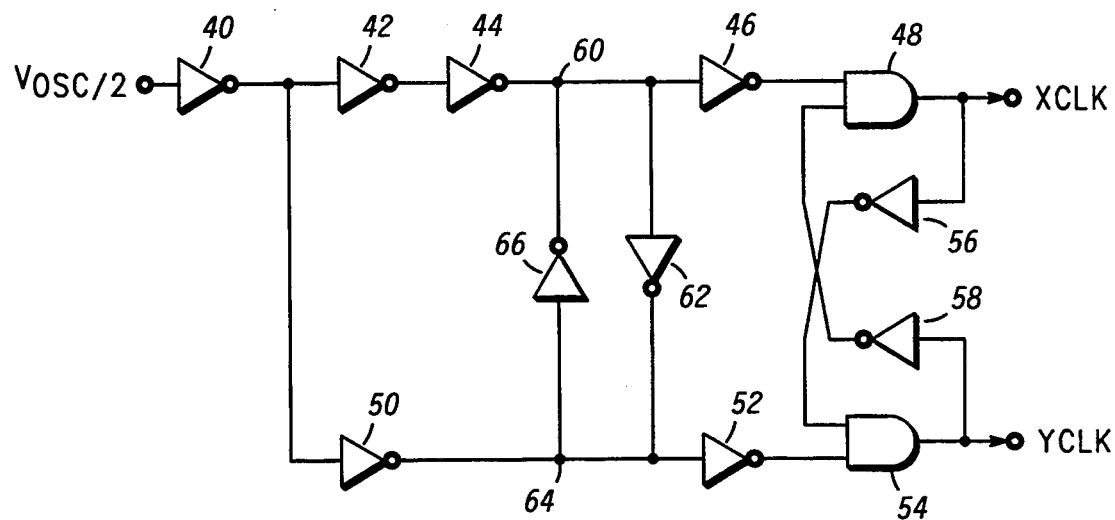
FIG. 2 is a schematic diagram illustrating the first opposite phase clock generator of FIG. 1.

Opposite phase clock generator 18 is shown in FIG. 2 where the $V_{OSC}/2$ signal is applied through inverters 40, 42, 44 and 46 to a first input of AND gate 48. The output of inverter 40 is coupled through inverters 50 and 52 to a first input of AND gate 54. The output of AND gate 48 provides the XCLK clock signal as applied through inverter 56 to a second input of AND gate 54. Likewise, the output of AND gate 54 provides the YCLK clock signal as applied through inverter 58 to a second input of AND gate 48. The output of inverter 44 at node 60 is coupled through inverter 62 to the input of inverter 52, while the output of inverter 50 at node 64 is coupled through inverter 66 to the input of inverter 46.

When the $V_{OSC}/2$ signal switches to logic zero, the output of inverter 40 goes to logic one. Inverter 50 attempts to switch node 64 to logic zero before node 60 switches to logic one because node 64 is only two inverter delays away from the $V_{OSC}/2$ signal while node 60 is three inverter delays away. However, the transition of node 64 to logic zero is slowed by inverter 62 because node 60 is still logic zero two inverter delays after the $V_{OSC}/2$ signal changes to logic zero. Inverter 62 acts to hold node 64 at logic one until the output of inverter 44 changes state. A similar scenario follows when the $V_{OSC}/2$ signal switches to logic one. Thus, the transition of inverters 46 and 52 overlap 180° out-of-phase and cross approximately at the 50% mark, thereby overcoming the delay difference imposed by an unequal number of inverters between the $V_{OSC}/2$ signal and nodes 60 and 64.

When the output of inverter 46 is logic zero, the XCLK clock signal at the output of AND gate 48 goes to logic zero. AND gate 54 receives logic ones from the outputs of inverters 56 and 52 for providing a logic one YCLK clock signal. When the output of inverter 52 goes to logic zero, the YCLK clock signal goes to logic zero. AND gate 48 receives logic ones from the output of inverters 46 and 58 for providing a logic one XCLK clock signal. Hence, the XCLK and YCLK clock signals are non-overlapping and opposite phase switching at substantially the 50% mark and operating at the frequency of the $V_{OSC}/2$ signal.

Figure 3:
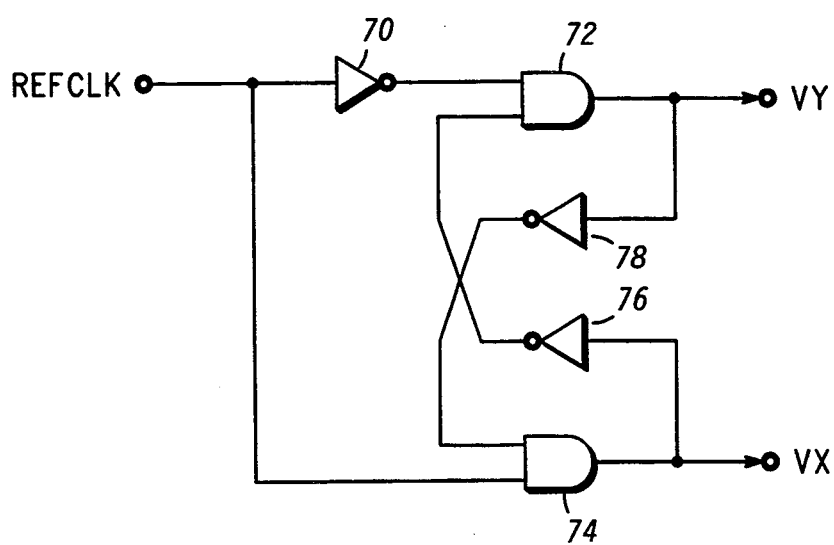
FIG. 3 is a schematic diagram illustrating the second opposite phase clock generator of FIG. 1.

Turning to FIG. 3, opposite phase clock generator 20 is shown in further detail where the REFCLK signal is inverted by inverter 70 and applied at a first input of AND gate 72 which provides the VY clock signal at its output. The input signal REFCLK is also applied at a first input of AND gate 74 for providing the VX clock signal at its output. The VX clock signal is complemented by inverter 76 and applied at a second input of AND gate 72. The VY clock signal is complemented by inverter 78 and applied at a second input of AND gate 74.

When the input signal REFCLK is logic zero, the VX clock signal at the output of AND gate 74 goes to logic zero. AND gate 72 receives logic ones from the outputs of inverters 70 and 76 for providing a logic one VY clock signal. When the input signal REFCLK goes to logic one, the VY clock signal goes to logic zero because of inverter AND gate 74 receives logic ones from the input signal REFCLK and the output of inverter 78 for providing a logic one VX clock signal. Hence, the VX and VY clock signals are non-overlapping and opposite phase.

In FIG. 4, down detector 24 operates in response to the XCLK and YCLK clock signals and produces a logic one DOWN_PULSE upon detecting a zero-going transition of the VY clock signal. When the VY clock signal is logic one, the output of inverter 80 is logic zero and the DOWN_PULSE signal at the output of AND gate 82 is logic zero. The logic one VY clock signal passes through transistor 84 when the XCLK clock signal is logic one. Inverter 86 complements the VY clock signal and transistor 88 passes the complemented VY clock signal when the YCLK clock signal becomes logic one. The VY clock signal returns to logic one at the output of inverter 90 and passes through transistor 92 during the following high state of the XCLK clock signal. After two more inversions through inverters 94 and 96, the logic one VY clock signal arrives at AND gate 82. The DOWN_PULSE signal remains logic zero because of the logic zero from inverter 80.

When the VY clock signal transitions to logic zero, the output of inverter 80 goes to logic one and the DOWN_PULSE signal at the output of AND gate 82 switches to logic one because the output of inverter 96 is still logic one. After one full period of the XCLK clock signal (logic one-to-logic zero-to-logic one), the logic zero VY passes through transistors 84, 88 and 92 and inverters 86, 90, 94 and 96 and arrives at AND gate 82. The DOWN_PULSE signal returns to logic zero. The VY clock signal must switch back to logic one to preset the output of inverter 96 to logic one before the next logic one DOWN_PULSE signal may occur. Thus, the DOWN_PULSE signal goes to logic one for approximately one period of the XCLK clock signal at each zero-going transition of the VY clock signal.

Returning to FIG. 1, the VX signal is applied at the first input of AND gate 30, while the second input of the same received an inverted DOWN_PULSE. Shift register 26 receives data from the output of AND gate 30 and shifts the data along the sixteen 1-bit locations in response to the XCLK and YCLK clock signals. The master-slave operation of shift register 26 requires non-overlapping, opposite phase XCLK and YCLK clock signals, wherein one clock transition latches the data into the master section while a subsequent clock transfers the data to the output of the slave section. A logic one DOWN_PULSE signal resets all bit cells of shift register 26 to logic zero. When the VX clock signal is logic one and the output of inverter 28 is logic one, the data input of shift register 26 receives a logic one. The XCLK and YCLK clock signals begin shifting logic ones along shift register 26 during the high state of the VX clock signal.

Recall the $V_{OSC}/2$ signal is one-half the output frequency of VCO 12. The VX and VY clock periods are 200 ns, and the high state of the VX clock signal is 100 ns. When down detector 24 detects a zero-going VY clock signal, shift register 26 is momentarily reset with all bit locations at logic zero. Since VX clock signal is logic one when VY clock signal is logic zero, shift register 26 begins shifting in logic ones as soon as the DOWN_PULSE returns to logic zero. When the VX clock signal returns to logic zero, AND gates 98 and 99 block further XCLK and YCLK clock signals. Shift register 26 stops shifting input data from AND gate 30.

If VCO 12 operates at 100 MHz because of worst case temperature and process conditions, then XCLK and YCLK clock signals operate at 50 MHz with 20 ns periods. Only output f1 is logic one because shift register 26 receives five XCLK and YCLK clock signals during the 100 ns high state of the VX clock signal ($5 \times 20$ ns $= 100$ ns). The first four XCLK and YCLK clock cycles fill the first four bits cells of shift register 26 but have no output. The fifth XCLK and YCLK clock cycle shifts a logic one into the fifth data cell and switches output f1 to logic one indicating VCO 12 is operating at 100 MHz.

If VCO 12 operates at 320 MHz in response to best case temperature and process, then XCLK and YCLK operate at 160 MHz with 6.25 ns periods. Outputs f1–f12 are all logic ones because shift register 26 receives sixteen XCLK and YCLK clock signals during the 100 ns high state of the VX clock signal ($16 \times 6.25$ ns $= 100$ ns). The fifth through the sixteen bit locations of shift register 26 represent 20 MHz steps. Thus, circuit 10 measures and quantifies the actual operating characteristics of VCO 12 as a function of temperature and process variation. The fifth bit cell (output f1) corresponds to a 100 MHz VCO output frequency with 20 MHz steps to the sixteen bit cell (output f12) which represents a 320 MHz VCO output frequency. It is understood that shift register may be expanded to achieve greater precision of the actual frequency of VCO 12.

Buffer circuit 32 is shown is FIG. 5 including twelve buffer blocks. The F1 buffer block is shown in detail and the remaining buffer blocks follow a similar construction. The VY clock signal is applied at a first input of AND gate 100, while a second input of the same receives output f1. The RESET signal is applied through inverter 102 to a third input of AND gate 100. The output of AND gate 100 is coupled to the base of transistor 104. The drain of transistor 104 receives power supply potential $V_{DD}$, while the source of transistor 104 is coupled through inverters 106 and 108 for providing output F1. Transistor 110 has a base receiving the RESET signal, a drain coupled to the input of inverter 106 and a source coupled to power supply conductor 112 operating at ground potential.

Assume that the output frequency of VCO 12 is such that outputs f1-f2 are logic one and outputs f3-f12 are logic zero. An active logic one RESET signal turns on transistor 110 and pulls the input of inverter 106 to logic zero to reset outputs F1-F12 to logic zeroes. When the VY clock signal is logic one and output f1 is logic one, the output of AND gate 100 goes to logic one (assuming RESET deactivated) and turns on transistor 104. Output F1 goes to logic one. Likewise, output F2 becomes logic one because output f2 is logic one. Outputs F3-F12 remain at logic zero when the VY clock signal is logic one because outputs f3-f12 are logic zero.

To this point, temperature and process sensing circuit. 10 has determined the actual operating frequency of VCO 12. Outputs F1-F12 have been set accordingly. It is understood that devices other than a VCO, e.g. a crystal oscillator, may provide similar quantifiable data regarding temperature and process conditions. A key feature of the present invention is using that information to compensate or adjust the INPUT SIGNAL to reflect the actual operating conditions. Assume that the INPUT SIGNAL as applied to compensation circuit 34 operates in a critical timing path. If, for example, the hold time of the INPUT SIGNAL is spec'd at 5 ns, it is possible for that hold time to vary between 5 and 20 ns depending on whether the temperature and process yields a best case or worst case scenario.

Figure 6:
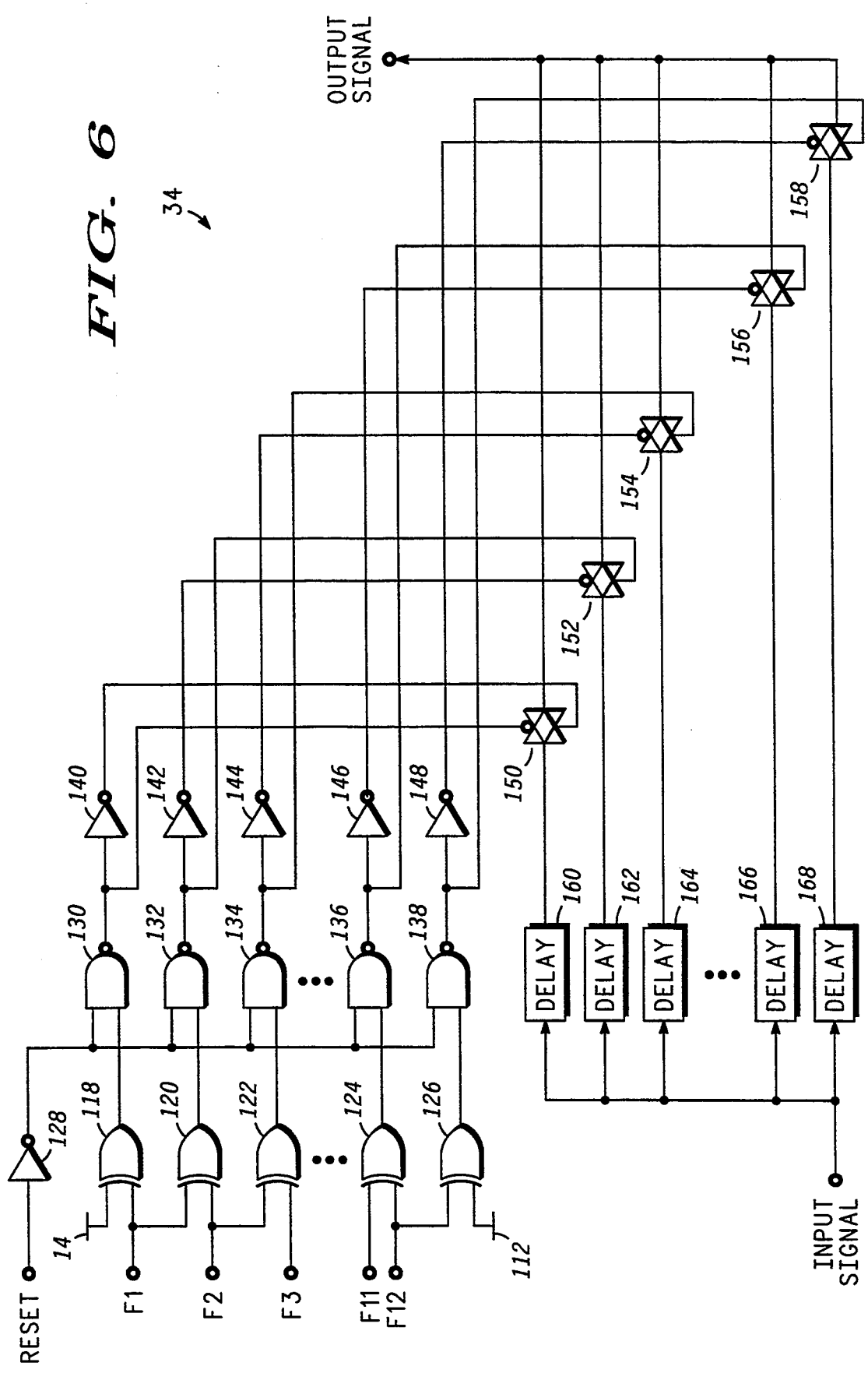
FIG. 6 is a schematic diagram illustrating a first embodiment of the compensation circuit of FIG. 1.

An embodiment of compensation circuit 34 is shown in FIG. 6 to correct for timing error caused by process and temperature variation. Outputs F1-F12 are coupled to thirteen exclusive-OR gates 118-126 as shown. One input of exclusive-OR gate 118 receives a logic one from power supply conductor 14 while one input of exclusive-OR gate 126 receives a logic zero from power supply conductor 112. With output F1 at logic one, the output of exclusive-OR gate 118 is logic zero. Likewise, the output of exclusive-OR gate 120 is logic zero because outputs F1 and F2 are logic one. The output of exclusive-OR gate 122 is logic one because output F2 is logic one and output F3 is logic zero. With outputs F3-F12 at logic zero, the outputs of exclusive-OR gates 122-126 are logic zero. Thus, the configuration provides one and only one logic one from the outputs of exclusive-OR gates 118-126 for any given combination of logic states from outputs F1-F12.

An active logic one RESET signal is inverted by inverter 128 and produces logic zeroes at the inputs of thirteen NAND gates 130-138 to disable and reset compensation circuit 34. When the RESET signal returns to logic zero, the logic one from exclusive-OR gate 122 forces the output of NAND gate 134 to logic zero. The outputs of other NAND gates 130-136 (except gate 134) are logic one. Thirteen inverters 140-148 provide complementary outputs of NAND gates 130-138. Thirteen transmission gates 150-158 receive the outputs of NAND gates 130-138 at their inverted inputs, respectively, and complemented outputs of the same at their non-inverted inputs. Transmission gates 150-158 may comprise back-to-back P-channel and N-channel transistors (not shown) with their drains and sources coupled together, as is well known. The inverted input is the gate of the P-channel transistor, and the non-inverted input is the gate of the N-channel transistor. With the output of NAND gate 134 at logic zero, only transmission gate 154 is enabled.

The INPUT SIGNAL is delayed the appropriate length of time to compensate for temperature and process variation by enabling the corresponding transmission gate to provide the same 2.0 ns delay independent of temperature and process conditions. It is important that delay circuits 160-168 experience the same temperature and process and power supply potential variation as VCO 12. That is, the inverters in delays circuits 160-168 must have same inherent delay and speed as a function of temperature and process as the inverters in VCO 12. Thus, for the example of a 5 ns hold-time requirement, under worst case processing, very little if any additional delay is needed, i.e. transmission gate 150 is enabled to activate delay circuit 160. As process and temperature conditions improve, more delay is necessary to achieve the desired 5 ns hold-time, i.e., delay circuit 164 activated in response to logic one outputs F1-F2 as described above. For absolute best case processing, transmission gate 158 is enabled by output F12 to activate delay circuit 168 and slow down the INPUT SIGNAL to achieve the desired 5 ns hold-time for the OUTPUT SIGNAL.

Figure 7:
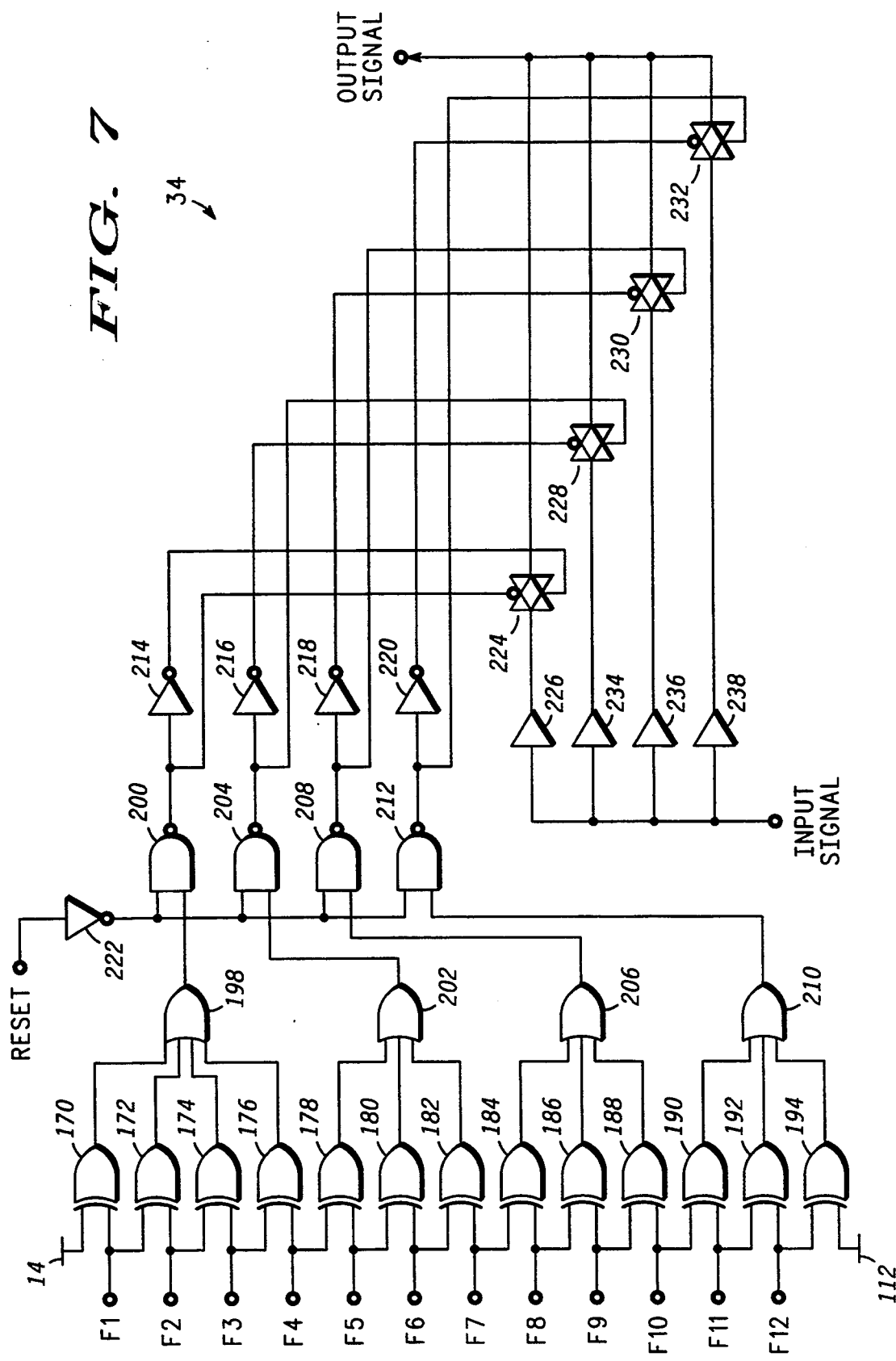
FIG. 7 is a schematic diagram illustrating a second embodiment of the compensation circuit of FIG. 1.

An alternate embodiment of compensation circuit 34 is shown in FIG. 7 to correct for switching thresholds variation after determining the nature of the process and temperature. Exclusive-OR gates 170-194 operate as described for exclusive-OR gates 118-126. OR gate 198 provides a logic one to NAND gate 208 when any one of exclusive-OR gates 170-176 goes to logic one. Likewise, OR gate 202 provides a logic one to NAND gate 204 when any one of exclusive-OR gates 178-182 goes to logic one. OR gate 206 provides a logic one to NAND gate 208 when any one of exclusive-OR gates 184-188 goes to logic one, while OR gate 210 provides a logic one to NAND gate 212 when any one of exclusive-OR gates 190-194 goes to logic one. Inverters 214-222 complement the output signals of NAND gates 200, 204, 208 and 212, respectively. OR gates 198, 202, 206 and 210 combine the output signals of exclusive-OR gates 170-194 into four groups. It is possible to eliminate OR gates 198, 202, 206 and 210 by including matching NAND gates for each exclusive-OR gate and correspondingly more transmission gates and buffers.

In a similar manner as described for compensation circuit 34 in FIG. 6, only one of OR gates 198, 202, 206 and 210 produces a logic one at its output. Again assuming outputs F1 and F2 are logic one and outputs F3-F12 are logic zero, exclusive-OR gate 174 goes to logic one and the output of NAND gate 200 goes to logic zero when the RESET signal is logic one following inverter 222. Transmission gate 224 is enabled to activate buffer 226. Transmission gates 228, 230 and 232 are disabled thereby blocking buffers 234, 236 and 238, respectively.

It is well known that temperature and process conditions affect switching thresholds. Worst case processing causes the widest range of switching thresholds, while best case processing results in the narrowest range of switching thresholds. The difference between buffers 226, 234, 236 and 238 is the sizing of the internal drive transistors (not shown) and associated switching thresholds. Buffer 226 may be sized to switch to logic zero at 0.8 volts and to logic one at 2.0 volts if driving TTL logic. Similarly, buffers 234, 236 and 238 switch to logic zero at 0.8 volts and to logic one at 2.0 volts but are sized differently to compensate for process and temperature variation.

Upon detecting worst case processing, or near worst case, one or more of outputs F1–F3 are logic one. Transmission gate 224 is enabled to activate buffer 226 with its geometry to achieve the desired switching thresholds. Under typical case processing, outputs F1–F3 are logic one and one or more of outputs F4–F6 are logic one. Transmission gate 228 is enabled to activate buffer 234 with its geometry to achieve the desired switching thresholds. Alternately, outputs F1–F6 may be logic one and one or more of outputs F7–F9 may be logic one to enable transmission gate 228 and activate buffer 236. Finally under best case processing, or near best case, outputs F1–F9 are logic one and one or more of outputs F10–F12 are logic one. Transmission gate 232 is enabled to activate buffer 238 with its geometry to achieve the desired switching thresholds. Controlling switching thresholds works for input buffers and output buffers arrangements.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A circuit, comprising:
   first means for generating first and second clock signals dependent on temperature and process variation;
   second means for generating third and fourth clock signals in response to an input clock signal;
   third means for counting a number of said first and second clock signals occurring during a first state of said third clock signal and providing a plurality of output signals indicative of said temperature and process variation, said third means including,
   (a) fifth means coupled for receiving said fourth clock signal and providing an output pulse at each first transition of said fourth clock signal,
   (b) a first AND gate having first and second inputs and an output, said first input receiving said third clock signal, said second input being coupled for receiving said output pulse from said fifth means,
   (c) a shift register having a data input, a clock input, a reset input, and a plurality of outputs, said reset input receiving said output pulse, said data input being coupled to said output of said first AND gate, said clock input receiving said first and second clock signals, and
   (d) a first buffer circuit having a control input coupled for receiving said fourth clock signal, a plurality of inputs coupled to said plurality of outputs of said shift register, and having a plurality of outputs for providing a plurality of buffered output signals; and
   fourth means having a first input coupled for receiving an input signal and a second input coupled for receiving said plurality of output signals from said third means, said fourth means providing an output signal with compensation for said temperature and process variation.

2. The circuit of claim 1 wherein said first means includes:
   a voltage controlled oscillator having a control input coupled for receiving a first power supply potential and having an output for providing an oscillator signal;
   a divider circuit having an input coupled for receiving said oscillator signal and having an output for providing a reduced frequency oscillator signal; and
   a first opposite phase clock generator having an input coupled for receiving said reduced frequency oscillator signal and having first and second outputs for providing said first and second clock signals.

3. The circuit of claim 2 wherein said second means includes a second opposite phase clock generator having an input coupled for receiving said input clock signal and having first and second outputs for providing said third and fourth clock signals.

4. The circuit of claim 3 wherein said third means further includes
   a first inverter having an input coupled for receiving said output pulse and having an output coupled to said second input of said first AND gate.

5. The circuit of claim 4 wherein said fourth means includes:
   a first exclusive-OR gate having first and second inputs and an output, said first input receiving a first one of said plurality of buffered output signals, said second input receiving a second one of said plurality of buffered output signals;
   a first NAND gate having first and second inputs and an output, said first input receiving a reset signal, said second input being coupled to said output of said first exclusive-OR gate;
   a second inverter having an input coupled to said output of said first NAND gate and having an output;
   a delay circuit having an input coupled for receiving said input signal and having an output; and
   a transmission gate having first and second control inputs and first and second conduction terminals, said first control input being coupled to said output of said first NAND gate, said second control input being coupled to said output of said second inverter, said first conduction terminal being coupled to said output of said delay circuit, said second conduction terminal providing said output signal.

6. The circuit of claim 4 wherein said fourth means includes:
   a first exclusive-OR gate having first and second inputs and an output, said first input receiving said first power supply potential, said second input receiving a first one of said plurality of buffered output signals;

a second exclusive-OR gate having first and second inputs and an output, said first input receiving said first one of said plurality of buffered output signals, said second input receiving a second one of said plurality of buffered output signals;

a first OR gate having first and second inputs and an output, said first input being coupled to said first output of said first exclusive-OR gate, said second input being coupled to said output of said second exclusive-OR gate;

a first NAND gate having first and second inputs and an output, said first input receiving a reset signal, said second input being coupled to said output of said first OR gate;

a second inverter having an input coupled to said output of said first NAND gate and having an output;

a second buffer circuit having an input coupled for receiving said input signal and having an output; and a transmission gate having first and second control inputs and first and second conduction terminals, said first control input being coupled to said output of said first NAND gate, said second control input being coupled to said output of said second inverter, said first conduction terminal being coupled to said output of said second buffer circuit, said second conduction terminal providing said output signal.

7. The circuit of claim 4 wherein said fifth means includes:

a first transistor having a gate, a drain and a source, said drain receiving said fourth clock signal, said gate receiving said second clock signal;

a second inverter having an input coupled to said source of said first transistor and having an output;

a second transistor having a gate, a drain and a source, said drain being coupled to said output of said second inverter, said gate receiving said first clock signal;

a third inverter having an input coupled to said source of said second transistor and having an output;

a third transistor having a gate, a drain and a source, said drain being coupled to said output of said third inverter, said gate receiving said second clock signal;

a fourth inverter having an input coupled to said source of said third transistor and having an output;

a fifth inverter having an input coupled to said output of said fourth inverter transistor and having an output;

a sixth inverter having an input coupled for receiving said fourth clock signal and having an output; and a second AND gate having first and second inputs and an output, said first input being coupled to said output of said fifth inverter, said second input being coupled to said output of said sixth inverter, said output providing said output pulse.

8. The circuit of claim 4 wherein said first buffer circuit includes:

a second AND gate having first, second and third inputs and an output, said first input being coupled to one of said plurality of outputs of said shift register, said second input receiving said fourth clock signal;

a second inverter having an input coupled for receiving a reset signal and having an output coupled to said third input of said second AND gate;

a first transistor having a gate, a drain and a source, said drain receiving said first power supply potential, said gate being coupled to said output of said second AND gate;

a second transistor having a gate, a drain and a source, said source receiving a second power supply potential, said drain being coupled to said source of said first transistor, said gate receiving said reset signal;

a third inverter having an input coupled to said output of said source of said first transistor and having an output; and a fourth inverter having an input coupled to said output of said third inverter and having an output for providing one of said plurality of buffered output signals.

9. A circuit for sensing process and temperature variation, comprising:

a voltage controlled oscillator having a control input coupled for receiving a first power supply potential and having an output for providing an oscillator signal;

a divider circuit having an input coupled for receiving said oscillator signal and having an output for providing a reduced frequency oscillator signal;

a first opposite phase clock generator having an input coupled for receiving said reduced frequency oscillator signal and having first and second outputs for providing first and second clock signals;

first means for generating third and fourth clock signals in response to an input clock signal;

second means for counting a number of said first and second clock signals occurring during a first state of said third clock signal and providing a plurality of output signals indicative of said temperature and process variation, said second means being reset at each first transition of said fourth clock signal; and third means having a first input coupled for receiving an input signal and a second input coupled for receiving said plurality of output signals from said third means, said third means providing an output signal with compensation for said temperature and process variation.

10. The circuit of claim 9 wherein said first means includes a second opposite phase clock generator having an input coupled for receiving said input clock signal and having first and second outputs for providing said third and fourth clock signals.

11. The circuit of claim 10 wherein said second means includes:

fourth means coupled for receiving said fourth clock signal and providing an output pulse at each transition of said fourth clock signal to a first state;

a first AND gate having first and second inputs and an output, said first input receiving said third clock signal;

a first inverter having an input coupled for receiving said output pulse and having an output coupled to said second input of said first AND gate;

a shift register having a data input, a clock input, a reset input, and a plurality of outputs, said reset input receiving said output pulse, said data input being coupled to said output of said first AND gate, said clock input receiving said first and second clock signals; and a first buffer circuit having a control input coupled for receiving said fourth clock signal, a plurality of inputs coupled to said plurality of outputs of said shift register, and having a plurality of outputs for providing a plurality of buffered output signals.

12. The circuit of claim 11 wherein said third means includes:
   a first exclusive-OR gate having first and second inputs and an output, said first input receiving a first one of said plurality of buffered output signals, said second input receiving a second one of said plurality of buffered output signals;
   a first NAND gate having first and second inputs and an output, said first input receiving a reset signal, said second input being coupled to said output of said first exclusive-OR gate;
   a second inverter having an input coupled to said output of said first NAND gate and having an output;
   a delay circuit having an input coupled for receiving said input signal and having an output; and
   a transmission gate having first and second control inputs and first and second conduction terminals; said first control input being coupled to said output of said first NAND gate, said second control input being coupled to said output of said second inverter, said first conduction terminal being coupled to said output of said delay circuit, said second conduction terminal providing said output signal.

13. The circuit of claim 11 wherein said third means includes:
   a first exclusive-OR gate having first and second inputs and an output, said first input receiving said first power supply potential, said second input receiving a first one of said plurality of buffered output signals;
   a second exclusive-OR gate having first and second inputs and an output, said first input receiving said first one of said plurality of buffered output signals, said second input receiving a second one of said plurality of buffered output signals;
   a first OR gate having first and second inputs and an output, said first input being coupled to said first output of said first exclusive-OR gate, said second input being coupled to said output of said second exclusive-OR gate;
   a first NAND gate having first and second inputs and an output, said first input receiving a reset signal, said second input being coupled to said output of said first OR gate;
   a second inverter having an input coupled to said output of said first NAND gate and having an output;
   a second buffer circuit having an input coupled for receiving said input signal and having an output; and
   a transmission gate having first and second control inputs and first and second conduction terminals, said first control input being coupled to said output of said first NAND gate, said second control input being coupled to said output of said second inverter, said first conduction terminal being coupled to said output of said second buffer circuit, said second conduction terminal providing said output signal.

14. The circuit of claim 11 wherein said fourth means includes:
   a first transistor having a gate, a drain and a source, said drain receiving said fourth clock signal, said gate receiving said second clock signal;
   a second inverter having an input coupled to said source of said first transistor and having an output;
   a second transistor having a gate, a drain and a source, said drain being coupled to said output of said second inverter, said gate receiving said first clock signal;
   a third inverter having an input coupled to said source of said second transistor and having an output;
   a third transistor having a gate, a drain and a source, said drain being coupled to said output of said third inverter, said gate receiving said second clock signal;
   a fourth inverter having an input coupled to said source of said third transistor and having an output;
   a fifth inverter having an input coupled to said output of said fourth inverter transistor and having an output;
   a sixth inverter having an input coupled for receiving said fourth clock signal and having an output; and
   a second AND gate having first and second inputs and an output, said first input being coupled to said output of said fifth inverter, said second input being coupled to said output of said sixth inverter, said output providing said output pulse.

15. The circuit of claim 11 wherein said first buffer circuit includes:
   a second AND gate having first, second and third inputs and an output, said first input being coupled to one of said plurality of outputs of said shift register, said second input receiving said fourth clock signal;
   a second inverter having an input coupled for receiving a reset signal and having an output coupled to said third input of said second AND gate;
   a first transistor having a gate, a drain and a source, said drain receiving said first power supply potential, said gate being coupled to said output of said second AND gate;
   a second transistor having a gate, a drain and a source, said source receiving a second power supply potential, said drain being coupled to said source of said first transistor, said gate receiving said reset signal;
   a third inverter having an input coupled to said output of said source of said first transistor and having an output; and
   a fourth inverter having an input coupled to said output of said third inverter and having an output for providing one of said plurality of buffered output signals.

* * * * *